United States Patent
McClintock

(10) Patent No.: US 10,600,293 B2
(45) Date of Patent: Mar. 24, 2020

(54) ACTIVATION OF SECURITY MECHANISMS THROUGH ACCELEROMETER-BASED DEAD RECKONING

(71) Applicant: Amazon Technologies, Inc., Seattle, WA (US)

(72) Inventor: Jon Arron McClintock, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/151,058

(22) Filed: Oct. 3, 2018

(65) Prior Publication Data

US 2019/0035238 A1     Jan. 31, 2019

Related U.S. Application Data

(63) Continuation of application No. 14/572,296, filed on Dec. 16, 2014, now Pat. No. 10,096,216.

(51) Int. Cl.
| | | |
|---|---|---|
| *G08B 13/14* | (2006.01) | |
| *G06F 3/01* | (2006.01) | |
| *G08B 29/18* | (2006.01) | |
| *G11C 13/00* | (2006.01) | |
| *G08B 13/08* | (2006.01) | |
| *G08B 13/12* | (2006.01) | |
| *G08B 21/02* | (2006.01) | |
| *G08B 13/24* | (2006.01) | |

(52) U.S. Cl.
CPC ......... *G08B 13/1436* (2013.01); *G06F 3/017* (2013.01); *G08B 13/1427* (2013.01); *G08B 29/188* (2013.01); *G08B 13/08* (2013.01); *G08B 13/12* (2013.01); *G08B 13/1418* (2013.01); *G08B 13/1454* (2013.01); *G08B 13/1463* (2013.01); *G08B 13/2448* (2013.01); *G08B 21/023* (2013.01); *G08B 21/0216* (2013.01); *G08B 21/0261* (2013.01); *G08B 21/0269* (2013.01); *G08B 21/0272* (2013.01); *G08B 21/0277* (2013.01); *G11C 13/0069* (2013.01)

(58) Field of Classification Search
CPC ............ G08B 13/1436; G08B 13/1418; G08B 13/1463; G08B 13/1454; G08B 13/12; G08B 13/08; G11C 13/0069; G06F 3/017
See application file for complete search history.

(56) References Cited

U.S. PATENT DOCUMENTS

| | | |
|---|---|---|
| 6,037,748 A | 3/2000 | Yee et al. |
| 6,529,144 B1 | 3/2003 | Nilsen et al. |

(Continued)

*Primary Examiner* — Adnan Aziz
(74) *Attorney, Agent, or Firm* — Davis Wright Tremaine LLP

(57) ABSTRACT

A system and method for activating security mechanisms based at least in part on accelerometer-based dead reckoning wherein accelerometer data, reflecting acceleration in a local coordinate system of a device, is obtained from an accelerometer of a device. Movement of the device is determined based at least in part on the accelerometer data, and, based at least in part on whether the movement of the device exceeds a threshold value, a determination is made whether to change a current security state of the device. If it is determined to change the current security state of the device, the current security state of the device is changed to a new security state.

19 Claims, 9 Drawing Sheets

(56) References Cited

U.S. PATENT DOCUMENTS

| | | | |
|---|---|---|---|
| 7,728,316 B2* | 6/2010 | Fadell | G06F 3/0304 250/559.38 |
| 8,058,985 B2 | 11/2011 | Dobson et al. | |
| 8,600,674 B1 | 12/2013 | Barbeau et al. | |
| 8,626,193 B1 | 1/2014 | Crossno et al. | |
| 8,648,799 B1 | 2/2014 | Lloyd | |
| 8,744,417 B2* | 6/2014 | Adler | H04M 3/42178 455/414.1 |
| 9,053,789 B1* | 6/2015 | Ertosun | G11C 13/0069 |
| 2002/0142792 A1 | 10/2002 | Martinez | |
| 2003/0017821 A1* | 1/2003 | Irvin | H04W 12/06 455/410 |
| 2004/0181703 A1 | 9/2004 | Lilja et al. | |
| 2006/0019724 A1* | 1/2006 | Bahl | G06F 1/3203 455/574 |
| 2007/0036348 A1 | 2/2007 | Orr | |
| 2007/0259716 A1 | 11/2007 | Mattice et al. | |
| 2007/0282468 A1 | 12/2007 | Tsujino et al. | |
| 2007/0294529 A1* | 12/2007 | Blair | G06F 21/6218 713/160 |
| 2008/0004798 A1 | 1/2008 | Troxler et al. | |
| 2008/0175443 A1* | 7/2008 | Kahn | G06F 21/32 382/115 |
| 2008/0218310 A1 | 9/2008 | Alten et al. | |
| 2008/0222692 A1* | 9/2008 | Andersson | G06F 21/33 726/1 |
| 2008/0255795 A1 | 10/2008 | Shkolnikov | |
| 2008/0290988 A1 | 11/2008 | Crawford | |
| 2009/0181695 A1 | 7/2009 | Wirola et al. | |
| 2010/0109948 A1 | 5/2010 | Razoumov et al. | |
| 2010/0141425 A1* | 6/2010 | Tracey | B65H 75/403 340/539.1 |
| 2010/0302025 A1 | 12/2010 | Script | |
| 2010/0304730 A1 | 12/2010 | Huang et al. | |
| 2010/0304754 A1 | 12/2010 | Czompo et al. | |
| 2011/0141006 A1 | 6/2011 | Rabu | |
| 2011/0167574 A1 | 7/2011 | Stout et al. | |
| 2012/0032834 A1 | 2/2012 | Weeks | |
| 2012/0188104 A1 | 7/2012 | Choi | |
| 2013/0023237 A1 | 1/2013 | Meredith et al. | |
| 2013/0093662 A1 | 4/2013 | Kalu et al. | |
| 2013/0104187 A1* | 4/2013 | Weidner | G06F 21/45 726/1 |
| 2013/0166049 A1 | 6/2013 | Werner et al. | |
| 2013/0166201 A1 | 6/2013 | Paim et al. | |
| 2013/0226505 A1 | 8/2013 | Kelly et al. | |
| 2013/0281120 A1 | 10/2013 | Oka et al. | |
| 2014/0068726 A1* | 3/2014 | Jakobsson | G06F 21/31 726/5 |
| 2014/0292674 A1* | 10/2014 | Lee | G09G 5/006 345/173 |
| 2014/0349632 A1* | 11/2014 | Chan | H04W 8/22 455/418 |
| 2015/0022434 A1 | 1/2015 | Matas | |
| 2015/0192420 A1 | 7/2015 | Watters et al. | |
| 2015/0230183 A1* | 8/2015 | Stogaitis | H04W 52/0254 455/574 |
| 2015/0247729 A1 | 9/2015 | Meduna et al. | |
| 2015/0248569 A1 | 9/2015 | Rushing | |
| 2015/0253146 A1 | 9/2015 | Annapureddy et al. | |
| 2015/0334532 A1 | 11/2015 | Christie et al. | |
| 2015/0373050 A1* | 12/2015 | Dayan | H04L 63/20 726/3 |
| 2016/0061600 A1* | 3/2016 | Dharawat | G06F 1/3231 702/150 |
| 2016/0068264 A1 | 3/2016 | Ganesh et al. | |
| 2016/0098076 A1* | 4/2016 | Chng | G06F 1/14 713/323 |

* cited by examiner

ACTIVATION OF SECURITY MECHANISMS THROUGH ACCELEROMETER-BASED DEAD RECKONING

CROSS-REFERENCE TO RELATED APPLICATION

This application is a continuation of U.S. patent application Ser. No. 14/572,296, filed on Dec. 16, 2014, entitled "ACTIVATION OF SECURITY MECHANISMS THROUGH ACCELEROMETER-BASED DEAD RECKONING," the disclosure of which is incorporated herein by reference in its entirety.

BACKGROUND

Many modern devices have software or hardware security features that are intended to prevent unauthorized access to consumer devices. Such features include requiring a user to enter credentials after a device has experienced a period of inactivity or requiring a user to enter credentials to decrypt sensitive information. However, these security features can be inconvenient when authorized users are unnecessarily forced to confirm their identity in situations where the device is at low risk for a security breach. On the other end of the spectrum, because such security features are often inflexible and do not take the user's surroundings and other environmental factors into account, such security features may be inadequate in situations where the device is at a high risk of a security breach.

BRIEF DESCRIPTION OF THE DRAWINGS

Various embodiments in accordance with the present disclosure will be described with reference to the drawings, in which.

DETAILED DESCRIPTION

Figure 1:
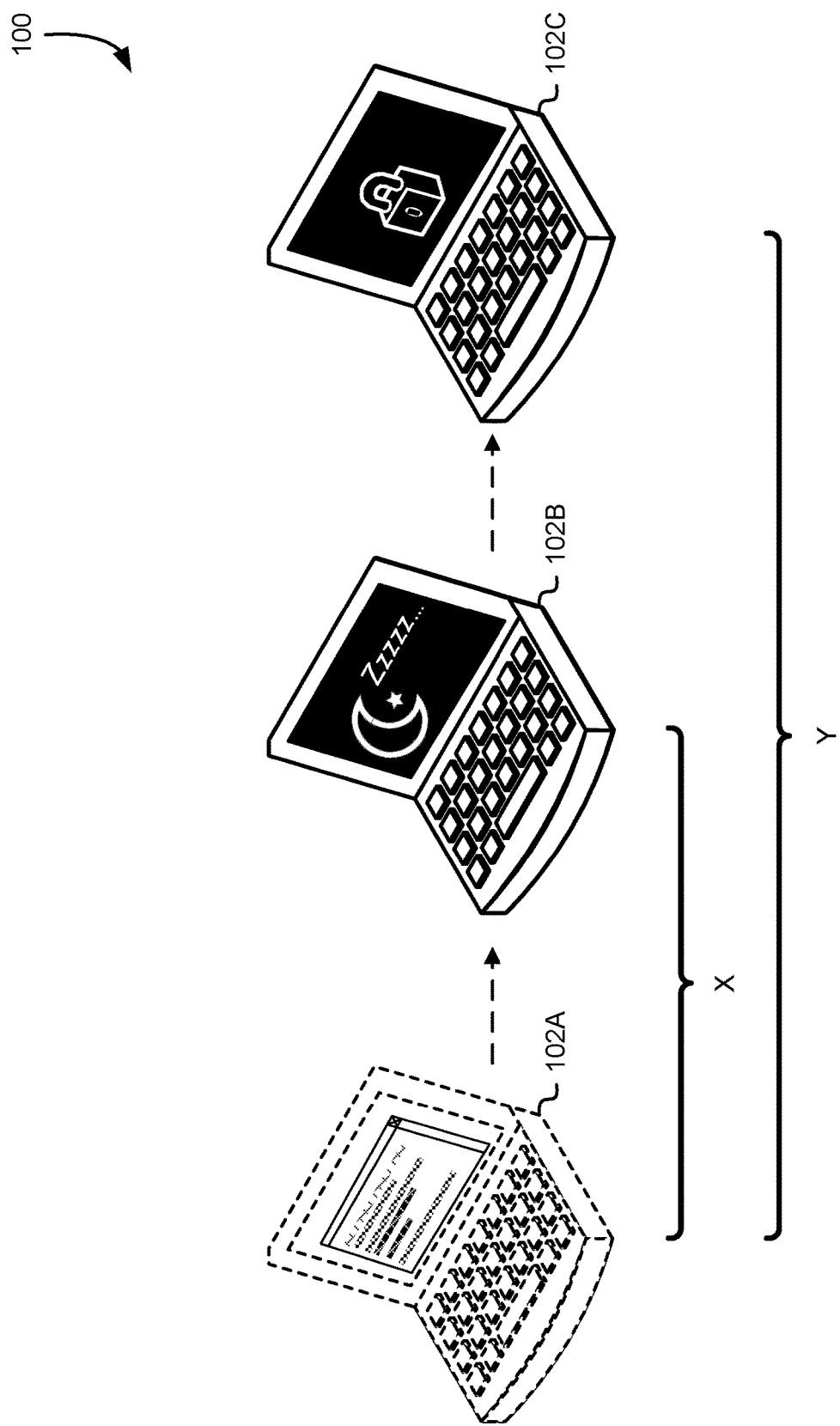
FIG. 1 illustrates an example of activation of security mechanisms using accelerometer-based dead reckoning in accordance with an embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested include receiving accelerometer data from a device, such as a proper acceleration of the device in three directions of a local coordinate system of the device (e.g., X, Y, and Z values in a Cartesian or spherical coordinate system with an origin centered at the device), determining the movement of the device based on the accelerometer data, and determining whether the movement triggers a change to the security state of the device. Changes to the security state include performing a security action (e.g., emitting an audible or visible alert, or locking the device), changing from one security profile to another security profile (e.g., changing from a "workplace" security profile to a "public area" security profile), and adjusting a threshold of the current security settings (e.g., reducing or increasing the amount of idle time to trigger a screensaver, etc.). The accelerometer data can also be combined with data received from other sensors on the device, including gyroscopes, compasses, image sensors, photosensors, microphones, clocks, global positioning system receivers, and temperature sensors to allow the device to assess the level of risk of security breach based on various environmental factors. In this manner, the device can be configured to adjust its security settings automatically, based on the estimated security risk of its current environment.

The aforementioned device may also be in communication with one or more other devices. In some embodiments, security actions are taken based on the proximity between the device and the one or more other devices. For example, if the device is a laptop and the accelerometer and other sensor data indicate that the laptop has moved more than 20 feet away from a second device, such as a cell phone, one or both devices may perform a security action such as raising an audible alarm or vibrating. Similarly, one device may be remotely located from the other device, one device may communicate a message indicating its movement, as detected by an accelerometer and/or other sensor data, to an intermediary device (e.g., third device), such as a central server or service. In some cases, the central server or service may be physically or geographically remote from the one device and the other device, but may be in communication with said devices through a network, such as a wired or wireless network, including the Internet. The central server or service may, in turn, relay a message to the other device. For example, a user located at a workplace may receive a message on a cell phone via a central server that the user's laptop, located at the user's home, is leaving the user's home. In some embodiments, the user is able to acknowledge that such movement is authorized by indicating such through the other device or by properly responding to a challenge-response from the intermediary device.

The described and suggested techniques improve the field of computing, and specifically the field of security for electronic devices, by providing a system that adjusts a security state of a device based at least in part on motion of the device. Additionally, the described and suggested techniques improve the functioning of computer systems by providing a versatile mechanism for combining input from accelerometers and other sensors to make intelligent assessments of security risk for a device. Moreover, the described and suggested techniques offer meaningful advantages over general device security by automatically recognizing authorized users, automatically detecting low-risk locations, and dynamically adjusting security states with minimal user input, thereby improving the user experience.

FIG. 1 illustrates an example 100 embodiment of the present disclosure. Specifically, FIG. 1 depicts a device 102A in a first security state that, based on accelerometer-based dead reckoning, transitions to a device 102B in a second security state after moving distance X, and then transitions to a device 102C in a third security state after moving distance Y. An accelerometer is an instrument or sensor for measuring proper acceleration, from which movement data may be derived. Proper acceleration may be measured in gravitational force (g-force) and is the physical acceleration experienced by an object not due to gravity. Therefore, an object at rest does not experience proper acceleration. Likewise, an object in free-fall, while experiencing coordinate acceleration due to gravity, does not experience proper acceleration. Accelerometers, such as micro electro-mechanical systems (MEMS) accelerometers, may be built-into mobile devices and may be used, at least in part, to detect motion, vibration, and orientation of the device. For example, an accelerometer integrated in a smart phone may be used in conjunction with a gyroscope to determine the current orientation of the device and thereby determine how to render the display (e.g., portrait vs. landscape) on the screen.

Dead reckoning is a calculation of an object's position based on the distance traveled since the object's previously measured position. Dead reckoning may be performed using an accelerometer by calculating the distance traveled from a previous position as a function of the object's proper acceleration over time. As one example, linear movement (that is, the straight-line distance between the positions of the device at two points in time) may be calculated by first integrating accelerometer data to yield velocity data, and then integrating the velocity data to yield distance data. By frequently monitoring accelerometer data (e.g., polling the accelerometer at frequent intervals or automatically receiving data from the accelerometer as soon as any movement is detected by the accelerometer), this distance data may allow the location of the device relative to a known location (e.g., as may be obtained from a global positioning system receiver) to be determined. In some situations, linear movement and/or velocity data may be calculated only in response to predetermined events, such as when acceleration of the device exceeds a particular threshold or some other trigger. By only performing such calculations as needed, such cases may provide a benefit of conserving battery by reducing power consumption of one or more processors of the device. Factoring data collected from other sensors, such as gyroscopes, magnetic field sensors, and global positioning systems, into the calculations may yield velocity and movement data that is more accurate, as well as other data, such as direction and location. The present disclosure contemplates using accelerometer-based dead reckoning for determining whether, and how, to trigger changes in a security state of a device. Furthermore, it is also contemplated in the present disclosure that more dynamic, flexible, and accurate determinations may be made by complementing the accelerometer data with data gathered from additional sensors, such as gyroscopes, magnetometers, global positioning systems, microphones, touch screens, photosensors, and image sensors.

The device 102A-C may be any type of device suitable for receiving accelerometer data and/or other sensor data and changing a security state based at least in part on the received data. Suitable devices include computing systems, mobile phones, laptop computers, tablet computers, e-readers, smart watches, head-mounted displays, and other similar mobile devices and wearable technology, and the electronic client device 902 described in FIG. 9. Furthermore, the systems of the present disclosure may be at least partially integrated into hard drives, network routers, consumer electronics, home appliances, home security systems, and clothing. For example, a home security system may act as a central system that receives the accelerometer data and/or other sensor data from one or more devices in order to monitor the devices, and may cause or perform certain actions based on the received data. Likewise, devices of the present disclosure may be affixed to clothing to prevent or deter theft. For example, an accelerometer-based dead reckoning device may be affixed to high-end shoes, and if an accelerator agent of the present disclosure determines that the shoes are leaving the retail floor without being purchased, may take a predetermined action, such sending an alert to a security system and activating a global positioning system (GPS) locator. The systems of the present disclosure are also contemplated for use in motor vehicles, shopping carts, bicycles, and other human-powered vehicles. Moreover, uses are contemplated for the systems of the present disclosure in wallets, handbags, passports, and credit cards.

In some embodiments, the accelerometer and/or other sensors are integrated into the electronics of the device 102A-C. In other embodiments, the accelerometer data and/or other sensors data are provided by a component, such as a dongle or other adapter, communicatively coupled to the device. In still other embodiments, the accelerometer component is incorporated into to an item and accelerometer data may be read from a separate device configured to read the accelerometer data of the accelerometer component. For example, the accelerometer component may be integrated into a passive or active radio-frequency identification (RFID) system (e.g., laminated into a passport), and a separate device may scan the RFID system to read the accelerometer data. The device 102A-C may include an accelerometer agent in hardware or software that performs calculations on the accelerometer data and/or other sensor data, checks the calculations against a set of security criteria, and signals whether a security state of the device 102A-C should be changed.

Based on detection, via one or more sensors, of an occurrence of an event, a security state of a device may be changed. In some examples, a "security state" may refer to the current settings of a device for one or more sets of security rules, thresholds, and actions (how much inactivity time before locking the device, vibration tolerance, whether the device should be locked or whether the screensaver should be activated, etc.). The security state may correspond to an estimation of risk of a security breach. For example, a device that detects itself to be in the presence of an authorized user (e.g., via facial recognition technology) and detects itself to be in a low-risk location (e.g., the authorized user's home or workplace), may, by default, be in a low-risk security state. The low-risk security state may have higher tolerance for certain events (e.g., moved a distance of 20 feet) or actions (e.g., the device never locks the screen while in this state), as compared to higher-risk security states. Likewise, a device that is unable to detect the presence of an authorized user and detects itself to be in a high-risk location (e.g., public park in the evening, etc.), may, by default, place itself into a high-risk security state. A high-risk security state may have lower tolerance for certain events (e.g., movement greater than one foot per second), actions (e.g., locking the screen after 15 seconds being idle), and may take stronger measures in response to detecting certain events (e.g., may wipe random access memory and encrypt the hard drive if it detects itself being turned upside down). There may be any number of possible intermediate-risk security states between low-risk and high-risk security states.

Additionally, a security state of a device may be affected by one or more security profiles. In some examples, "security profile," in contrast to a security state, may refer to metadata associated with something (a user, location of the device, environmental or other determinable condition, etc.). The metadata may reflect a level of security risk, and the metadata may be used for setting the security state of the device. For example, the owner of a device may be associated with a profile that, as long as the device detects itself to be under the control of the owner of the device, places the device in a low-risk security state as defined by a security profile for the owner of the device. Similarly, a user authorized by the owner to use the device may be associated with a profile that places the device in an intermediate-risk security state as defined by a security profile of the authorized user, as long as the device detects itself to be under the control of the authorized user. Likewise, if the device detects itself to be under the control of an unrecognized user, the device may place itself into a high-risk security state as defined by an unrecognized user security profile. In the same way, there may be a different security profile for when the device detects itself to be in the workplace of an authorized user versus when the device detects itself to be in the home of the authorized user. Similarly, there may be a different security profile for the device during normal working hours versus outside the normal working hours.

As illustrated in FIG. 1, the device 102A may initially be in a low-risk security state. That is, an owner or other authorized user of the device may be actively using or working on the device. Thereafter, the device 102A is moved a distance "X." The distance X may be any distance moved that may be determined from data received from an accelerometer and/or other sensors within or coupled to the device 102A. The device 102B reflects the device 102A after having been moved beyond distance X. The device 102B has been placed in a heightened/elevated security state, which in the example 100 involves placing the device 102B in a mode (e.g., activating a screen saver, turning the screen off, entering a low-power "sleep" mode, etc.) that hides the data on the screen from casual observers.

Note too, that, at distance X, the device 102B may still be moving. The device 102C reflects the device 102A after having been moved beyond a distance "Y," where Y is greater than X. The device 102C has been placed in a higher security state than the security state of the device 102B. In the example 100, this may involve locking the system and/or encrypting data in memory and/or persistent storage such that credentials of an authorized user may need to be provided in order to unlock the system and/or decrypt the data. Note that there may be any number of higher or lower security states than those illustrated with device 102A-C.

As noted, an accelerometer attached to or integrated with a device may output measurements of proper acceleration, which, in turn may be used to calculate distance traveled by the device over time. In some cases, data received from a GPS receiver of the device may be used for refining the accelerometer data and/or perform additional filtering. For example, accurate location of the device may be further obtained from an integrated GPS receiver or cell of origin (COO) positioning technology. Because a GPS receiver may consume more power than an accelerometer, power may be conserved by using the GPS receiver only as needed, such as, for example, validating whether the device is in a relatively safe (e.g., low-security risk) location when such is indicated by the accelerometer data. Orientation and directional determinations may be supplemented with output from integrated gyroscopes, such as MEMS gyroscopes and magnetometers. Such information may be further coupled with information from photosensors and temperature sensors.

Figure 2:
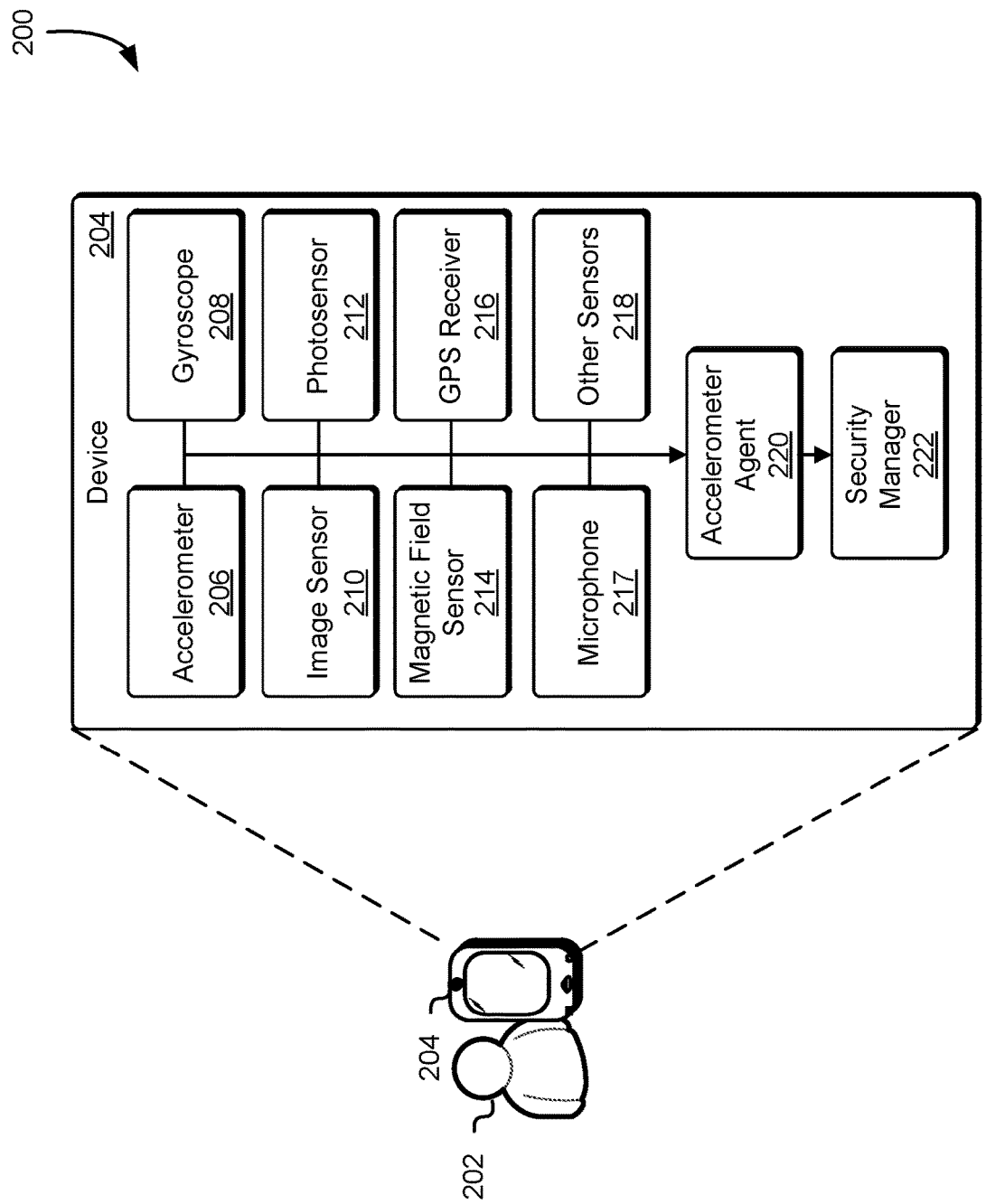
FIG. 2 illustrates an example of a device in accordance with an embodiment.

FIG. 2 illustrates an example 200 representation of a device 204 of the present disclosure. As illustrated in FIG. 2, the example 200 includes a user 202 with a device 204, which may be a mobile device or any device similar to the device 102A-C. The device 204 may comprise, among other components of the device, one or more movement sensors, such as an accelerometer 206 for measuring acceleration or deceleration, a gyroscope 208 for determining rotation. The device 204 may also comprise one or more sensors that gather data from which movement may be derived (i.e., movement-based sensor) or which may be combined or filtered with other movement data, such as a global positioning system receiver 216 for determining location, a magnetic field sensor 214 for determining direction, an altimeter, a pressure sensor, Doppler-based sensors, echolocation-based sensors, and a rangefinder. The device may also comprise other miscellaneous sensors, such as one or more image sensor 210 for capturing images and depth of field information, one or more microphone 217 for capturing sound, and a photosensor 212 for measuring light levels. Note that in some implementations, the device may be configured to use one or more image sensors to detect movement (e.g., by difference analysis of successive image captures, using motion compensation algorithms to detect tilt, by computing focal length differences determined from auto-focus functionality, etc.). Sensors not specifically named in FIG. 2 have been collectively grouped as other sensors 218. The device 204 may also include an accelerometer agent 220 for interpreting data received from sensors 206-18 and a security manager 222 component for adjusting a security state of the device 204.

The accelerometer 206 may be configured to sense and output data about the proper acceleration of the device. For example, the accelerometer may output values reflecting acceleration in X, Y, and Z directions in a local coordinate system of the device. Note that, although the present disclosure discusses output values in terms of a Cartesian/orthogonal coordinate system and Euclidean space, other coordinate systems which do not necessarily utilize an orthonormal basis (e.g., spherical coordinate systems, cylindrical coordinate systems, etc.), may be used, such as for the sake of computational expedience. The accelerometer may comprise one or more of a piezoelectric, piezoresistive, capacitive, MEMS accelerometer, or any other type of accelerometer suitable for use by the system of the present disclosure.

The gyroscope 208 may be configured to sense and output angular velocity of the device. For example, the gyroscope 208 may output values reflecting angular velocity around three axes of a local coordinate system (e.g., X, Y, and Z axes of an orthogonal coordinate system centered at the device) of the device. The angular velocity may be used to calculate the angular displacement of the device, which may be used to ascertain the orientation of the device. The gyroscope 208 may comprise one or more of a vibrating structure gyroscope (also known as Coriolis vibratory gyroscope), rotating gyroscope, MEMS gyroscope, attitude indicator, or any other type of gyroscope suitable for use by the system of the present disclosure.

The image sensor 210 may be configured to capture still and photographic images within its field of view. The image sensor may be comprised of one or more charge-coupled devices, active pixel sensors, or any other image sensor suitable for converting an optical image into an electronic signal. The image sensor 210 may be used to capture an image of the user 202 of the device for facial recognition or other purposes. The device 204 may include more than one image sensor, in which case the image sensors may be utilized to determine depth of field information. Differences between two successive image captures by the image sensor 210 may also be utilized to calculate motion of objects within the field of view of the image sensor, motion and rotation of the device, and distance between the device and objects within the field of view of the image sensor. This data may be used in conjunction with the accelerometer and other image sensors to improve the accuracy of calculations for the movement of the device.

The photosensor 212 may be configured to detect and output light intensity levels of the present environment of the device. The photosensor 212 may, for example, be usable to determine whether the device has been placed in the dark (e.g., a pocket). The magnetic field sensor 214 (also known as a magnetometer) may be configured to provide directional information about the object and the direction of travel of the object, for example by detecting magnetic north. The magnetic field sensor 214 may be any type of magnetic field sensor suitable for providing information about detected magnetic fields, such as a MEMS magnetic field sensor or any other magnetic field sensor usable by the system of the present disclosure.

The GPS receiver 216 may be configured to received location information from a global positioning system. Additionally or alternatively, location information may be received using cell of origin positioning techniques or other positioning techniques. The GPS receiver may be used to calibrate and correct errors in calculations using accelerometer. For example, the GPS data may be used to determine where in a global coordinate system (e.g., the world coordinate system) the origin of the local coordinate system of the device is located. Likewise, the GPS receiver may be used to calibrate and correct errors with gyroscope data; e.g., GPS data may be used to improve the accuracy of the gyroscope 208 by providing location data usable to calculate true north from magnetic north (e.g., based on magnetic declination).

The device 204 may also include at least one microphone 217 for detecting sound. The microphone 217 may be any type of microphone that may be integrated into the device 204, and may be usable to detect environmental noise and/or voice detection, recognition, and vocal patterns. Multiple microphones may additionally be configured to provide directional information as to the source of noise and echolocation. The other sensors 218 include other components of the device 204 usable for determining whether to adjust a security state of the device 204. Such other sensors 218 may include, but are not limited to, a sensor for detecting/measuring atmospheric pressure, a sensor for detecting/measuring physical/mechanical pressure, an altimeter, a thermometer or other temperature sensor, an internal clock of the device 204 for determining time of day, a fingerprint scanner, and a touch screen display of the device 204 for detecting taps, gestures, typing speeds, touch patterns, and finger sizes.

The accelerometer agent 220 may be implemented to analyze measurements made by the accelerometer 206 and/or the sensors 208-18, and, based at least in part on its analysis, determine whether one or more actions should be taken. The accelerometer agent 220 may be implemented in hardware or may be implemented in software as a set of executable instructions being executed by one or more processors. The accelerometer agent 220 may be configured to receive data from the accelerometer 206 and/or the sensors 208-18 and make decisions based at least in part on whether the received data does or does not match specified criteria. The accelerometer agent 220 may compare the received data against the specified criteria to determine whether an event has occurred for which a security action should or should not be taken. In some examples, a "security action" may refer to an action that causes a change in a security state of the device. Examples of security actions include allowing an authenticated user to access the device without requiring proof of credentials or conversely requiring proof of credentials, disconnecting or maintaining connection to a network, encrypting volatile or persistent storage, locking or unlocking the device, causing the device to emit an audible alert, causing the device to vibrate, causing the device to switch from an active security profile to one or more different security profiles, and notifying network security profile of a potential security breach of the device.

As an example, the accelerometer agent 220 of the device 204 may receive data indicating that the device 204 has moved away from a designated "safe" location (e.g., an office of an authorized user), indicating the occurrence of an event for which increased security precautions may be implemented. As another example, a touch screen of the device 204 may receive data indicating that an authorized user has tapped three times on the top-right corner of the screen, which may be an agreed-upon signal indicating that the accelerometer agent 220 is, at least temporarily, to suspend taking certain actions based on the accelerometer 206 data and/or data from the sensors 208-18.

Determinations by the accelerometer agent 220 to increase or decrease a security state may be provided to the security manager 222. The security manager 222 may be hardware or software configured to cause the device 204 to perform security actions or adjust security settings. For example, the security manager 222 may be configured to lock the device 204 after a period of inactivity has exceeded a threshold. As another example, the security manager may be able to erase memory, encrypt memory, encrypt persistent storage, erase persistent storage, erase credentials or cryptographic keys, as directed by the accelerometer agent 220. Note that the security manager 222 may comprise one or more various components of the device 204, including power management components and user security components, and may be implemented as any combination of hardware or software.

As noted in this disclosure, in some embodiments, multiple devices are in communication with each other, and events may be determined based on various factors, including device type and proximity between devices. In some embodiments, the multiple devices involve a central monitoring system or service and one or more devices being monitored by the central monitoring system or service. In such embodiments, undoing certain security actions, such as locking the device, requires validation (e.g., via multi-factor authentication, challenge-response authentication, etc.) from the central monitoring system. In other embodiments, the multiple devices are in direct communication in a peer-to-peer relationship.

Figure 3:
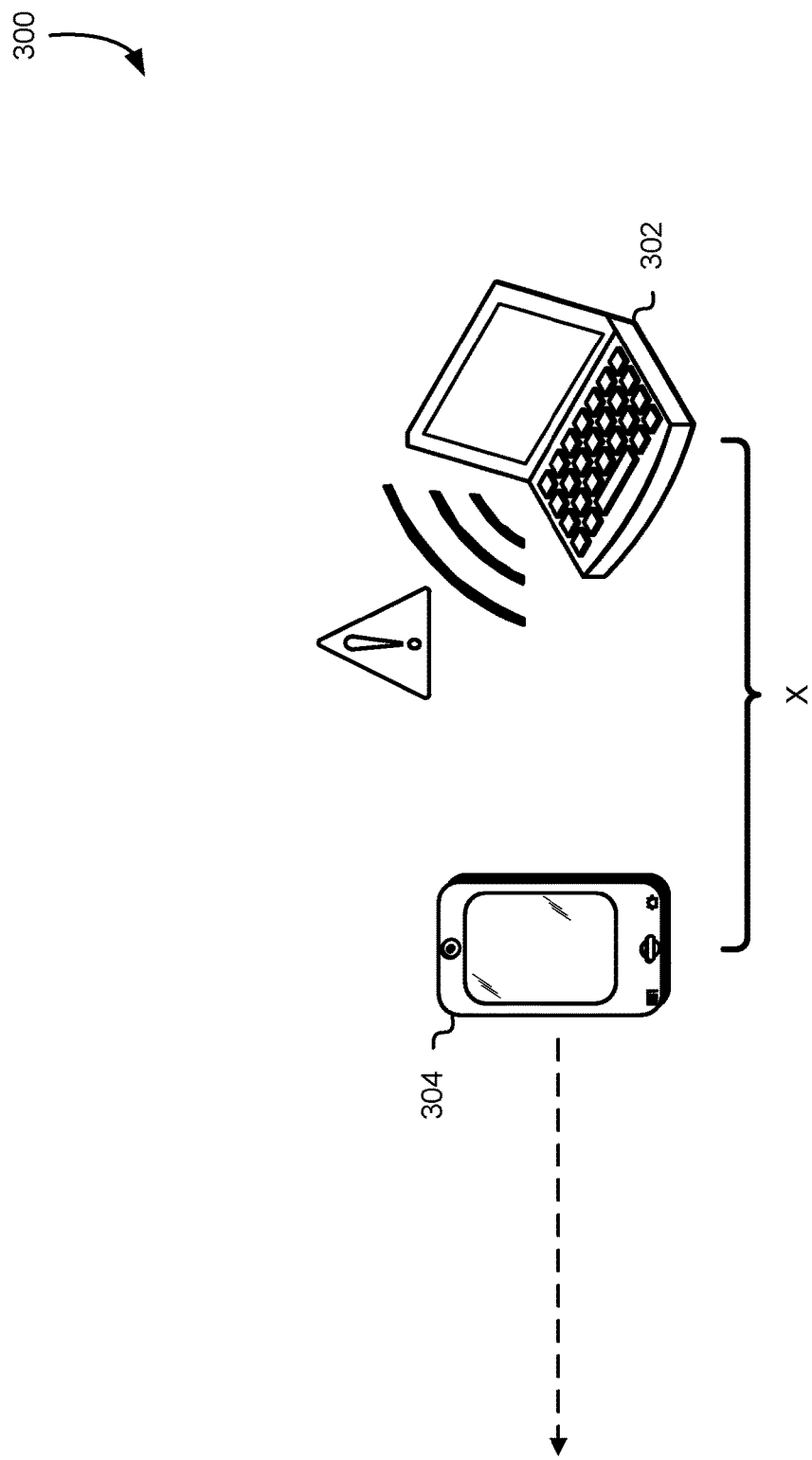
FIG. 3 illustrates an example of an accelerometer-based dead reckoning proximity event in accordance with an embodiment.

FIG. 3 illustrates an aspect of an environment 300 of an embodiment of the present disclosure. Specifically, FIG. 3 depicts a first device 302, pictured as a laptop, in wireless communication with a second device 304, pictured as a mobile phone, where the second device 304 is moving beyond a distance X from the first device 302. Note, the first device 302 and second device 304 may be any type of device suitable for implementing the system of the present disclosure, such as the types of devices described in reference to the device 102A-C of FIG. 1. Note also that it is contemplated that the first device 302 and the second device 304 need not be in direct wireless communication with each other; for example, the first device 302 may have a wired connection to a network and may be able to communicate with a central server through the network, and the second device 304 may also be able to communicate with the central server, which may act as an intermediary between the first device 302 and the second device 304. In this manner, the second device 304 may be remote (e.g., out of Wi-Fi range) from the first device 302 and still receive information about the status of the first device 302.

In the environment 300, an accelerometer or proximity sensor in the second device 304 of a user may detect that it is moving away from the first device 302, which may also belong to the user. If the second device 304 moves more than a threshold distance X (e.g., 50 feet) away from the first device 302, the second device 304 may send a signal to the first device 302 indicating that it has moved beyond distance X. In the environment 300, a current security profile may specify that a separation of the second device 304 of more than distance X from the first device 302 is suggestive of theft of the second device 304 by a third party (e.g., the user may have the first device 302 and the second device 304 in a public area, such as a coffee shop, which may cause a corresponding "public area" security profile to be implemented at this location). In such a case, upon receipt of the signal from the second device 304, the first device 302 may beep, vibrate, or otherwise sound a message informing the user that the movement of the second device 304 may be unauthorized.

The user may acknowledge receipt of the message by either moving the first device 302 and the second device 304 into close proximity of each other (e.g., less than distance X) or by providing input to the second device 304 (e.g., a predetermined series of gestures or taps on a touch screen, etc.). The second device 304 may communicate the acknowledgement to the first device 302, which may then cease sounding its alarm. If acknowledgement is not provided, in some cases, the second device 304 may presume its movement is unauthorized and may elevate its security status (e.g., encrypting data, emitting an audible or visible alarm, etc.), and, additionally or alternatively, the first device 302 may communicate the event to appropriate personnel (e.g., network security administrators, etc.).

Figure 4:
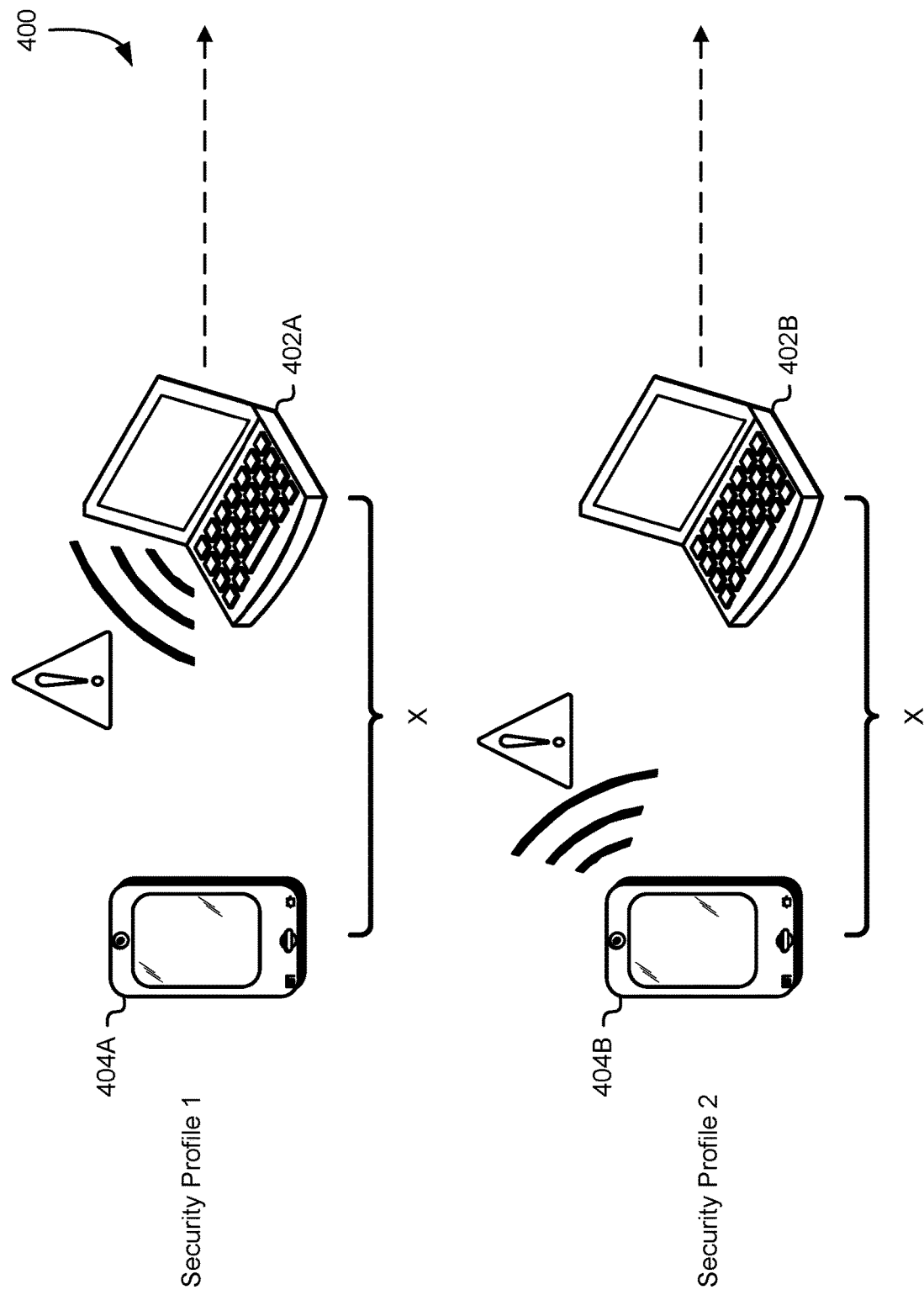
FIG. 4 illustrates an example of an alternate accelerometer-based dead reckoning proximity event in accordance with an embodiment.

FIG. 4 illustrates an aspect of an environment 400 of an embodiment of the present disclosure. Specifically, FIG. 4 depicts a first device 402A-02B, pictured as a laptop, in wireless communication with a second device 404A-04B, pictured as a mobile phone, where the first device 402A-02B is moving beyond a distance X from the second device 404A-04B. Note, the first device 402A-02B and second device 404A-04B may be any type of device suitable for implementing the system of the present disclosure, such as the types of devices described in reference to the device 102A-C of FIG. 1. Note also that it is contemplated that the first device 402A-02B and the second device 404A-04B need not be in direct wireless communication with each other; for example, the first device 402A-02B may have a wireless connection to a network and may be able to communicate with a central server through the network, and the second device 404A-04B may also be able to communicate with the central server, which may act as an intermediary between the first device 402A-02B and the second device 404A-04B.

In the environment 400, an accelerometer or proximity sensor in the first device 402A-02B of a user may detect that it is moving away from the second device 404A-04B, which may also belong to the user. If the first device 402A moves more than a threshold distance X (e.g., 20 feet) away from the second device 404A, the first device 402A may send a signal to the second device 404A indicating that it has moved beyond distance X. In the environment 400, a security profile ("Security Profile 1") may specify that a separation of the first device 402A of more than distance X from the second device 404A is suggestive that the user has accidentally left the second device 404A behind (e.g., the user may have the first device 402A and the second device 404A in a workplace, which may cause a corresponding "workplace" security profile to be implemented at this location). In such a case, the first device 402A may beep, vibrate, or otherwise sound a message informing the user that the second device has been left behind.

Alternatively, in the environment 400, a security profile ("Security Profile 2") may specify that a separation of the first device 402B of more than distance X from the second device 404B is suggestive that of theft of the first device 402B by a third party (e.g., the user may have the first device 402B and the second device 404B in a public area, such as a coffee shop, which may cause a corresponding "public area" security profile to be implemented at this location). In such a case, upon receipt of the signal from the first device 402B, the second device 404B may beep, vibrate, or otherwise sound a message informing the user that the movement of the first device 402B may be unauthorized.

In either scenario, the user may acknowledge receipt of the message by either moving the first device 402 and the second device 404 into close proximity of each other (e.g., less than distance X) or by providing input to the first device 402 and/or the second device 404 (e.g., a predetermined series of gestures or taps on a touch screen, a predetermined sequence of key presses the laptop device, etc.), depending on the particular security profile. Upon receipt of the acknowledgement, the device sounding the alarm may then cease sounding its alarm. If acknowledgement is not provided, in some cases, the first device 402 may presume its movement is be unauthorized and may elevate its security status (e.g., encrypting data, emitting an audible or visible alarm, etc.), and, additionally or alternatively, the first device 402 and/or the second device 404 may communicate the event to appropriate personnel (e.g., network security administrators, etc.).

An event calling for some action to be performed may be determined to have occurred based at least in part on acceleration or deceleration of a device (deceleration being negative acceleration). For example, if a device has suddenly (e.g., abruptly) accelerated to a high speed from a previous state of little or no motion, it may indicate that the device has been suddenly stolen and is being rapidly carried away. Such abrupt acceleration may be determined by the acceleration of the device exceeding a predetermined threshold. Similarly, if the device is traveling at an unanticipated velocity (such as, the device is traveling at a speed consistent with automobile travel, but the security profile indicates that the user should be on foot), it may also indicate that the device has been stolen and is being driven away. Likewise, if an accelerometer in a laptop device detects that the device has been turned upside-down, it may indicate that an entity is attempting to access the memory or hard drive of the device. The detection of such events may cause the system of the present disclosure to go into a state of elevated security and take certain actions. Examples of certain actions, include, but are not limited to, encrypting memory and/or the hard drive, clearing out the memory, sending an alert to a central server or service, displaying a visible alert on a display screen, flashing a blinking red light, and/or causing the speaker of the device to produce an audible alarm noise.

An event calling for some action to be performed may be determined to have occurred based at least in part on a location of the device. For example, sensors on the device may output values indicating that the device has moved from a first room in the home of a user to a second room in the home of the user. Such an event may trigger an action, such as locking a screen of the device and disconnecting from a connected virtual private network. Conversely, the sensors of the device may determine that, although an authorized user may have been away from the device for an extended period of time and the device has entered sleep mode, the device is located in the home of the authorized user and the still in the same location as when the user was last operating the device and connected to a virtual private network, and, in response to the detection of this event, the device may determine to remain connected to the virtual private network even after the device awakens from sleep mode.

An event calling for some action to be performed may be determined to have occurred based at least in part on a temperature of the device. For example, the device may detect, based on temperature sensors embedded in the device, that the temperature has experienced an unusual drop, possibly indicating that the memory of the device is being cryogenically frozen in an attempt to bypass encryption of the data in memory. In such a case, the device may perform a security action such as saving all unsaved data to an encrypted file system, saving the state of the running system to the encrypted file system, and erasing all data, including cryptographic keys, from the memory of the device.

An event calling for some action to be performed may be determined to have occurred based at least in part on a light level. For example, the device may note that a light level has suddenly changed from light to dark, matching criteria indicating that the device has been placed in a pocket or satchel. In such a case, the device may respond by electronically locking the device, turning off the screen, and bypass polling of input from a touch screen.

An event calling for some action to be performed may be determined to have occurred based at least in part on user identification. For example, if voice or facial recognition by the device indicates that an authorized user is accessing the device, the device may determine that no change to a security state is needed. On the other hand, if the device is unable to recognize the user attempting to access the device, the device may require that the unrecognized user supply some credentials or other information usable to establish the unrecognized user as a user authorized to access the device. An event calling for some action to be performed may be determined to have occurred based at least in part on an executing application. For example, the device may be playing music through connected headphones and motion detected by an accelerometer is consistent with the motion of jogging. In such an event, the device may determine to make no change to the current security state. Conversely, if the currently running application on the device is an electronic reader application for reading digital media and the motion detected by the accelerometer is consistent with jogging, the detected event may be suggestive of theft of the device (i.e., being unlikely that the authorized user is reading while jogging) and take an appropriate security action.

An event calling for some action to be performed may be determined to have occurred based at least in part on time, such as may be determined from a clock on the device or from a time signal received by the device, such as through a Wi-Fi signal. For example, the device may utilize different security profiles depending on whether the current time is within working hours or whether the current time falls outside working hours. In such a case where the device detects that the time has passed from working hours to outside hours (e.g., 5:00 pm to 5:01 pm), the device may change from the working hours security profile to the outside working hours profile. Note that various types of time values may be used to determine the occurrence of an event, including a particular date, a day of the week, a season of the year, a time of day, a month, a year, and time/date ranges associated with any of the above.

As noted, in some cases, detected events may cause certain actions not to be triggered. For example, if a user is authenticated on a mobile device, puts the mobile device in his pocket, and pulls the device out again, the device may detect, such as through an accelerometer determining that the user has not moved and through facial recognition via an image sensor recognizing the authenticated user, that it is unnecessary to re-authenticate the user. Similarly, if the device is a laptop located in the home of an authorized user, the device may determine, if an accelerometer in the device detects that the device has not moved, not to lock the laptop screen even if the authorized user has been away from the device for an extended period. As another example, a user may tap or shake the device in a particular way that indicates that the device is to suspend monitoring or triggering of certain events. For example, a user may tap a location of the screen of a mobile device three times prior to taking an automobile trip with the device as a signal to the device to ignore, for a certain time period (e.g., 15 minutes), vibrations and/or acceleration/deceleration associated with the movement of the vehicle.

In the event that a security state of a device is elevated due to an event detected in accordance with a method described in the present disclosure, in some embodiments an authorized user performs certain actions to restore the state of the device to a previous state. For example, if an authorized user is wearing sunglasses and the facial recognition capability of a device is unable to recognize the authorized user, the smart phone may prompt the user to remove the glasses in order to unlock the device. As another example, if an accelerometer or other sensor in a first device, such as a laptop computer, detects that the first device has exited a safe location (e.g., the authorized user's house), a second device, such as a mobile phone, may receive a notification of this movement from the first device or from a central monitoring system, and the second device may present a confirmation dialog requesting that the user verify that the movement of the first device is authorized. In this manner, if the authorized user is the user moving the first device, the authorized user can acknowledge that the movement of the first device is approved.

On the other hand, if the first device is being moved without approval of the authorized user, the confirmation gives notice of the unauthorized movement of the first device to the authorized user who then may act accordingly. In some cases, the user, upon being notified of unauthorized movement of the first device, may select, from the second device, one or more remediation actions to be taken. Such remediation actions could include passive security actions such as causing the hard drive of the first device to be encrypted and erasing random access memory of the first device, and/or active security actions such as causing the first device to emit an audible alarm, and/or notifying security or other authorities of potential theft of the first device. In some cases, such remediation actions may be predetermined and may be automatically applied by the first device within a certain time after the movement is detected unless a confirmation is received from the authorized user that the movement is approved.

In some cases, additional filters, such as a Kalman filter, may be applied to obtained sensor data to smooth out peaks and jitters in the data. In some cases, determination that an event has occurred may depend on hysteresis of the device when it was in a similar environment, condition, or location. For example, a device set on the dashboard of a vehicle may use hysteresis from past motion detected while on the dashboard of the vehicle to differentiate between jittering motions due to normal motion of the vehicle versus motion inconsistent with motion of the vehicle.

Figure 5:
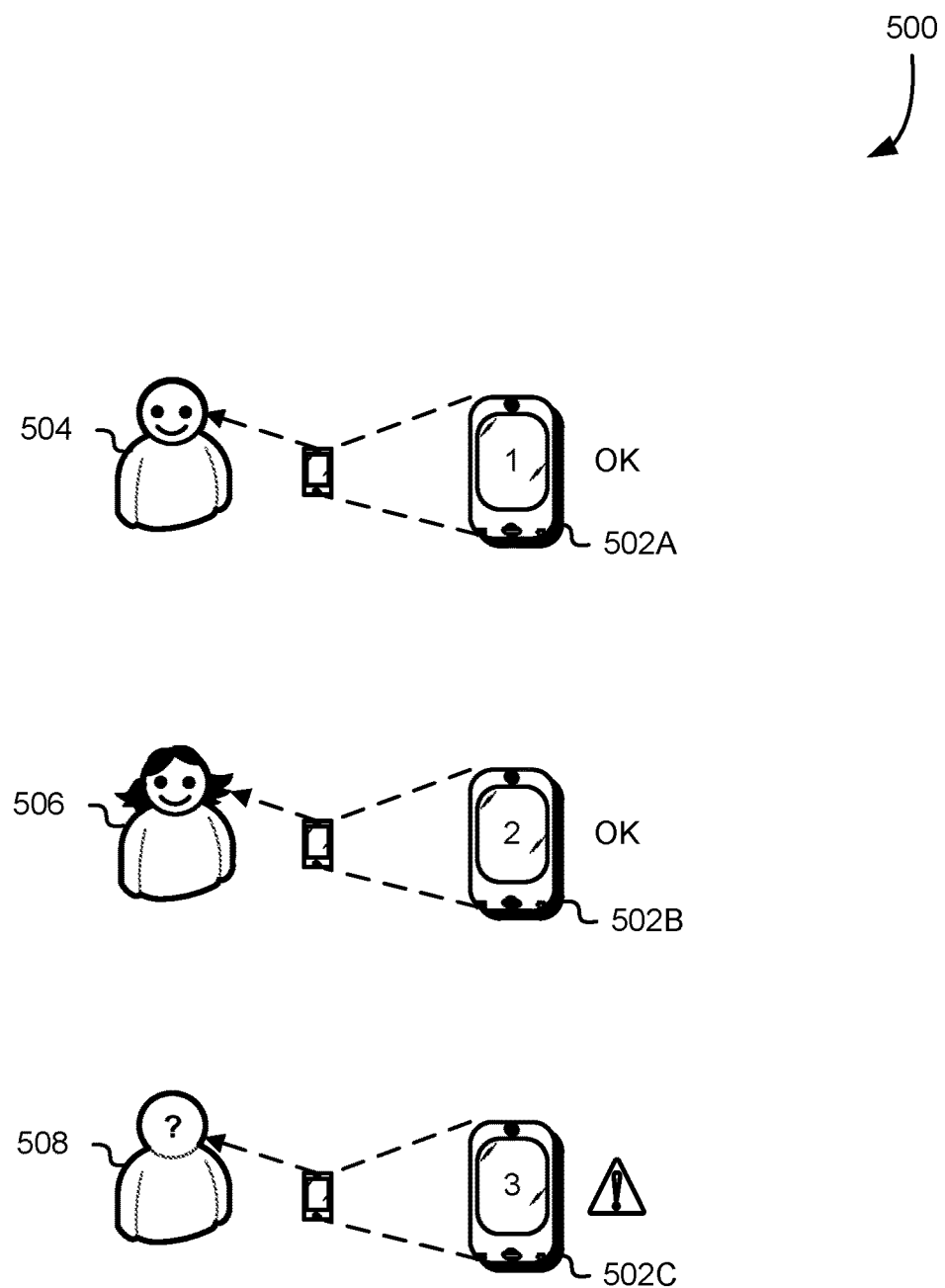
FIG. 5 illustrates an example of changing a security state based at least in part on user recognition in accordance with an embodiment.

FIG. 5 illustrates an example 500 of changing a security profile based on recognition of a user in an embodiment of the present disclosure. Specifically, FIG. 5 depicts a device 502A-02C in three different security states based on recognition or lack of recognition by the device 502A-02C of users 504-08. Note, the device 502A-02C may be any type of device suitable for implementing the system of the present disclosure, such as the types of devices described in reference to the device 102A-C of FIG. 1.

In the example 500, a first user 504 may be the owner of the device or some other user, such as network security personnel authorized to use the device at a high level of clearance. In such a case, the device 502A may receive accelerometer and/or other sensor data indicating that it is being moved and/or accessed. The device 502A may receive further sensor data usable to recognize the identity of the first user 504. For example, an accelerometer and/or other sensors may recognize the gait of the first user 504 as belonging to the first user 504. Similarly, an image sensor of the device 502A may provide an image of the face of the first user 504 to a facial recognition component which may recognize the face as belonging to the first user 504. Likewise, a touch screen of the device 502A may provide data usable to identify the first user 504, such as finger size, typing speed, or touch pattern. A variety of methods are contemplated for recognizing users other than those mentioned, including vocal patterns, passwords and other credentials, and fingerprint recognition. The first user 504, now recognized by the device, may be able to operate the device 502A under a first security profile, which may presume a low risk of a security breach of the device.

Also in the example 500, a second user 506 may seek to use the device 502B. In the example 500, the second user 506 may be authorized to use the device 502B, but may have less security clearance than the first user 504. Thus, in this case, the device 502B may assume a second security profile to reflect a higher risk of a security breach than the security profile associated with the first user 504. For example, as compared to the first security profile, the second security profile may require the second user 506 to enter credentials each time the second user 506 attempts to access the device, whereupon the first security profile may only require the first user to enter credentials to access the device once per day.

Also in the example 500, a third user 508 may seek to use the device 502C. In the example 500, the third user 508 may not be authorized to use the device 502C or the device 502C may be unable to recognize the third user 508 as an authorized user (e.g., the third user 508 may be the first user 504 wearing sunglasses, thereby confusing a facial recognition component of the device 502C). In this case, the device 502C may assume a third security profile to reflect a highest risk of a security breach. In such a case, the device 502 may respond by encrypting random access memory, clearing cache, and encrypting data on persistent storage and may maintain the third security profile until an authorized user authenticates him/herself with the device 502C.

Changes to the security state of a device may include switching from one security state to another security state or from one security profile to another security profile. For example, if a device is unable to detect the presence of an authorized user, the device may place itself in a high-risk security state. Similarly, if a photosensor detects a decrease in light levels below a certain threshold, it may switch to a nighttime security profile and an associated security state. Additionally or alternatively, a change to a security state may include changing one or more parameters or thresholds of the current security state. For example, in a current security state, the device may be configured to turn off its display after 15 minutes of inactivity. Upon detection of a certain event (e.g., moving the device from a private office in a workplace to a public lobby of the workplace), the security state may be changed such that the device is configured to turn off its display after five minutes of inactivity.

Figure 6:
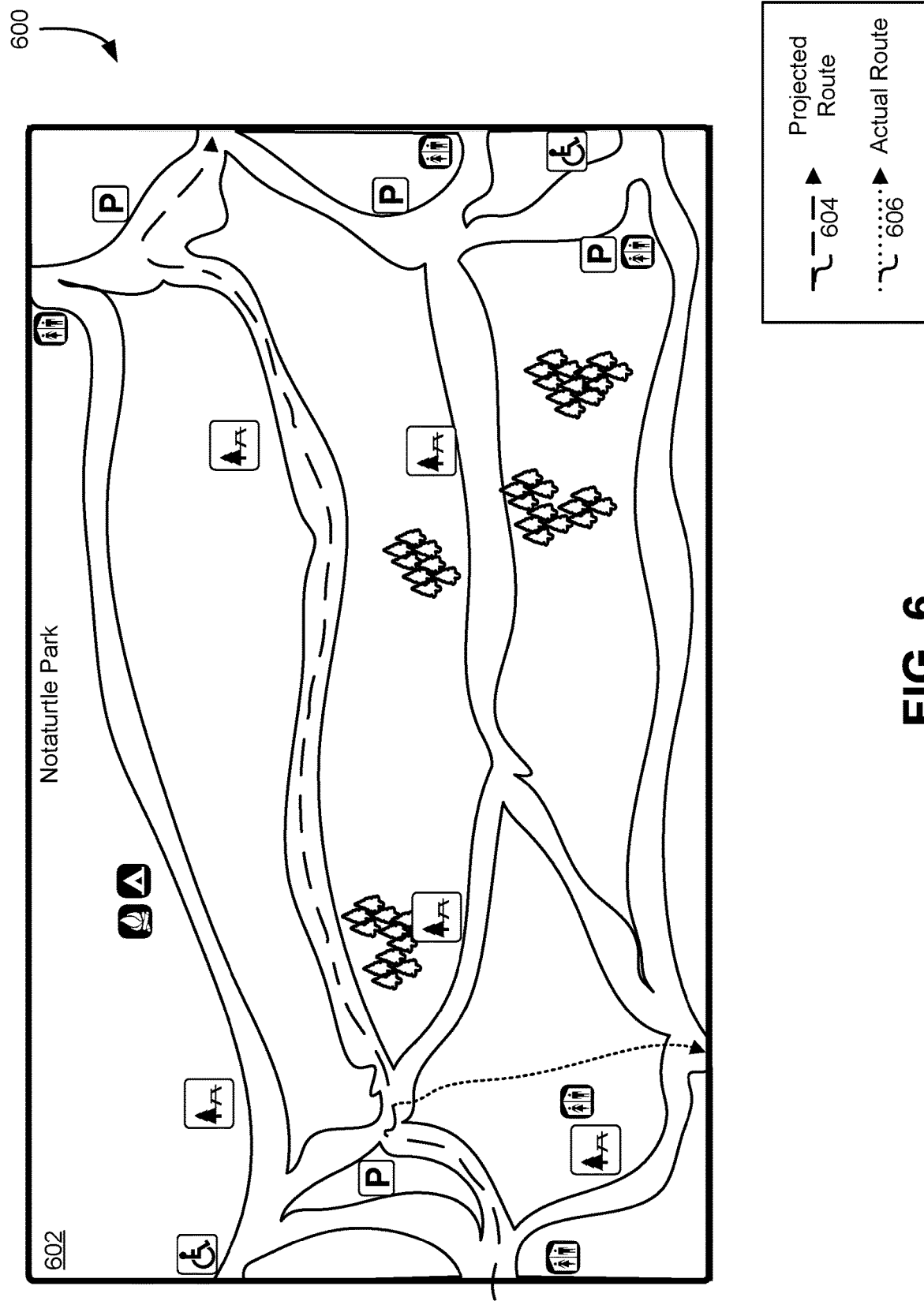
FIG. 6 is illustrates an example of a route deviation event in accordance with an embodiment.

FIG. 6 illustrates an example 600 of an embodiment of the present disclosure. Specifically, FIG. 6 depicts a map 602, such as may be generated by a mapping application on a device of a type suitable for implementing the system of the present disclosure, such as the types of devices described in reference to the device 102A-C of FIG. 1. In the example 600, the device may have determined a projected route 604 for the user to traverse through the area depicted by the map 602. However, as illustrated, the device has detected, via an accelerometer and/or other sensor data with reference to the projected route 604, that it has deviated from the projected route 604, as shown by the actual route 606. In such a case, the current security profile of the device may indicate that such a deviation is suggestive of a theft of the device. As a result, an accelerometer agent and security manager, such as the accelerometer agent 220 and security manager 222 of FIG. 2, may cause the device to enter a heightened security state (e.g., emitting an alarm noise, wirelessly communicating the event to a remote server, encrypting persistent storage, etc.). If a false alarm, an authorized user of the device may indicate that the unexpected deviation from the projected route 604 is not a security breach, such as by logging into the device using valid credentials, whereupon the security state of the device may be reduced and security actions (such as audible alarms, persistent storage encryption, etc.) may be stopped.

Figure 7:
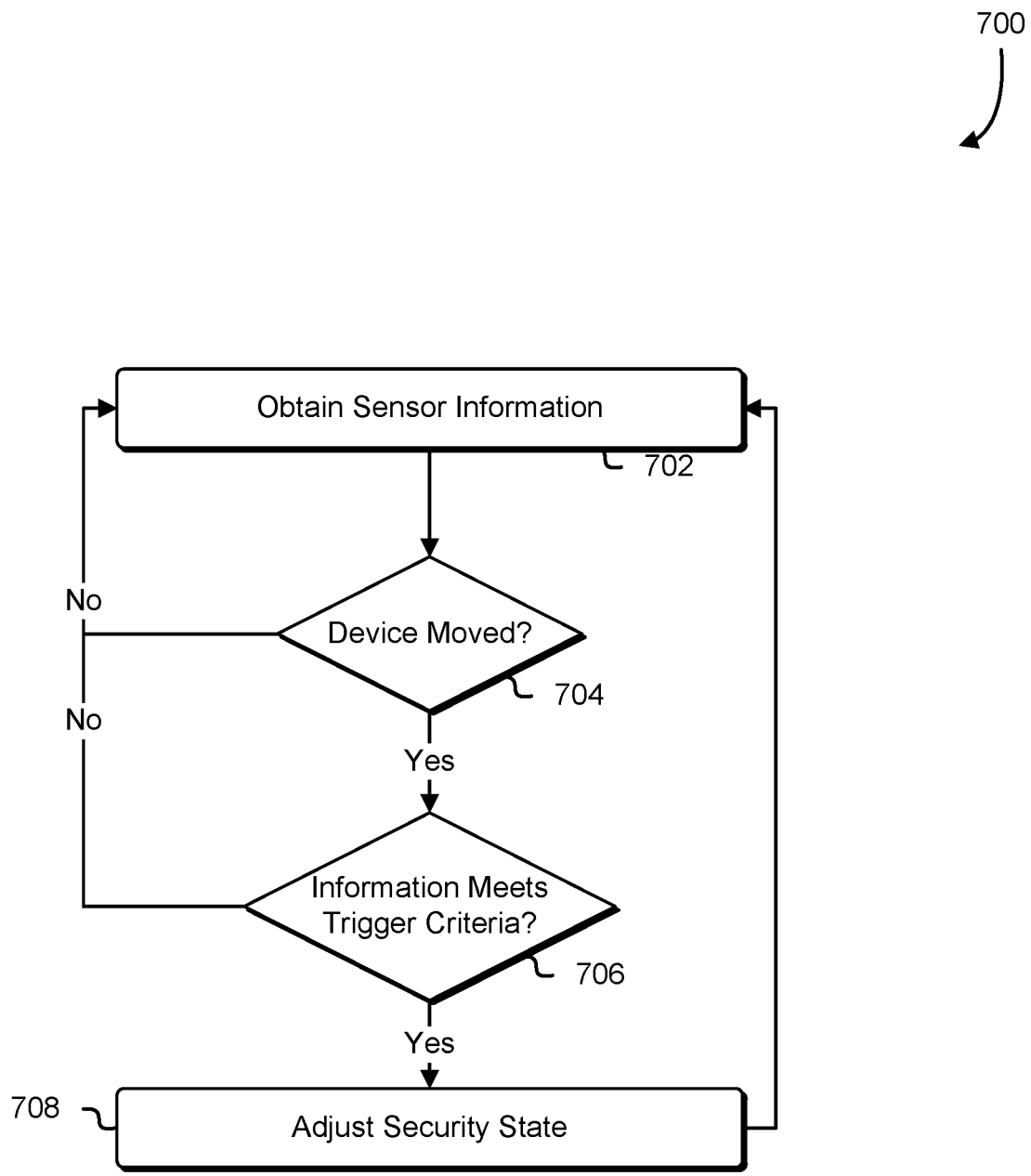
FIG. 7 is a flow chart that illustrates an example of activation of security measurements based at least in part on sensor input in accordance with an embodiment.

FIG. 7 is a flow chart illustrating an example of a process 700 for changing a security state of a device in response to sensor data in accordance with various embodiments. The process 700 may be performed by any suitable device, such as the device 102A-02C. Furthermore, one or more operations of the process 700 may be performed by a computer system in communication with the device, such as a server in a data center, multiple computing devices in a distributed system of a computing resource service provider, or any electronic client device such as the electronic client device 902 described in conjunction with FIG. 9. The process 700 includes a series of operations wherein sensor information of the device is received, such as by an accelerometer agent 220 from one or more sensors such as sensors 206-18, and a determination is made whether the sensor information indicates an adjustment of a security state is necessary.

In 702, a device polls or otherwise receives data from one or more sensors. For example, the device may receive values corresponding to proper acceleration in X, Y, and Z local coordinates of the device, may receive values reflecting angular velocity around X, Y, and Z axes of a local coordinate system of the device, image data captured by the device, audio data recorded by the device, and location information from a global positioning system. In 704, the device performing the process 700 determines from accelerometer data and/or other data obtained from sensors whether the device has moved. Note that, depending on the sensitivity of the accelerometer and/or other sensors, miniscule movements of the device may be detected even though the device is simply sitting on a flat surface, such as a table or desk. In such cases, determination that the device has moved in 704 may include determining that the device has moved more than a threshold amount (e.g., half an inch, 0.5 centimeters, etc.) sufficient to indicate the occurrence of an event.

If the device has not moved enough to indicate the occurrence of an event, the device performing the process 700 may return to 702, continuing between 702-04 until movement sufficient to indicate the occurrence of an event is detected. If such movement is detected, the device performing the process 700 may proceed to 706, whereupon the sensor information may be compared against predetermined criteria usable to determine whether an event meriting a change in the security state of the device has occurred.

As an example, the device may detect that it has moved but the movement data, combined with the most recent global positioning system location data of the device, indicates that the device is still located within the home of an authorized user. The device may refer to a security profile for the device in this location (e.g., "user home profile"); whereupon the criteria of the profile may indicate that no security actions or changes to a security state need to be taken under these conditions. In another example, the device may detect that it has moved and that a facial recognition component is unable to recognize the presence of an authorized user from image data received from an image sensor on the device. In this example, the device may refer to the current security profile, whereupon criteria of the profile may indicate that security actions (such as locking the device until a valid password of an authorized user is received) or changes to a security state (reducing the idle time threshold that indicates when a screen should be turned off) should be taken. In a similar way, the sensor information may suggest that, because an authorized user has or has not been recognized or because the current location of the device reflects a higher or lower security risk, the device should switch to a different security profile relevant to the current conditions.

In a case where the sensor information matches more than one set of event criteria, in 706, the device may determine to take the most restrictive security action associated with the matching sets of event criteria. For example, if the sensor information indicates that the device has moved to a public area, which would normally trigger a change to a first security state, but the sensor information also indicates that the device has experienced a sudden drop in temperature, which would normally trigger a change to a second security state, the device may determine to change to the most restrictive security state between the first and second security states. Alternatively, the device performing the process 700 may change to a combination of both the first and second security states and choose the most restrictive action only where the change to the security states conflict. For example, if moving to a public area matches criteria configured to cause the device to encrypt random access memory using a SHA-256 hash function and turn off the screen until an authorized user is authenticated by the device, and the sudden drop in temperature matches criteria configured to cause the device to encrypt random access memory using a SHA-512 hash function and sound a warning beep, the occurrence of both events may cause the device to perform the most restrictive combination of all three actions (e.g., turn off the screen, encrypt memory using SHA-512, and sound a warning beep).

Note that criteria for determining whether to change a security state may be complex. For example, there may be criteria to determine whether the device is moving, the speed of that the device is moving, whether the device is accelerating or decelerating, and the rate at which the device is accelerating or decelerating. Other examples include the current temperature, how much the temperature has changed since a specified time, the rate at which the temperature is changing, the current environmental illumination, and the rate at which the environmental illumination is increasing or decreasing. Still other criteria include the current orientation, a measurement of a change in orientation (e.g., rotation), rate at which orientation is changing, whether the device recognizes the user (e.g., by facial recognition, gait, fingerprint, password, etc.), and, if recognized, what access permissions the recognized user has.

If the received sensor information does not indicate that a security action should be taken or that a change to a security state should be made, the device performing the process 700 may return to 702 and may repeat the operations of 702-06 until the sensor information triggers a change in a security state, or indicates a need to switch to a different security profile or take a security action. On the other hand, if the sensor information does suggest the necessity of making a change to a security state, security profile, or taking a security action, the device performing the process 700 may proceed to 708. In 708, the device performing the process 700 may, as determined appropriate according to the criteria of 706, take a security action, change to a different security profile, or change a security state of the device. Thereafter, the device performing the process 700 may return to 702 and repeat the operations of 702-08. Note that one or more of the operations performed in 702-08 may be performed in various orders and combinations, including in parallel.

Figure 8:
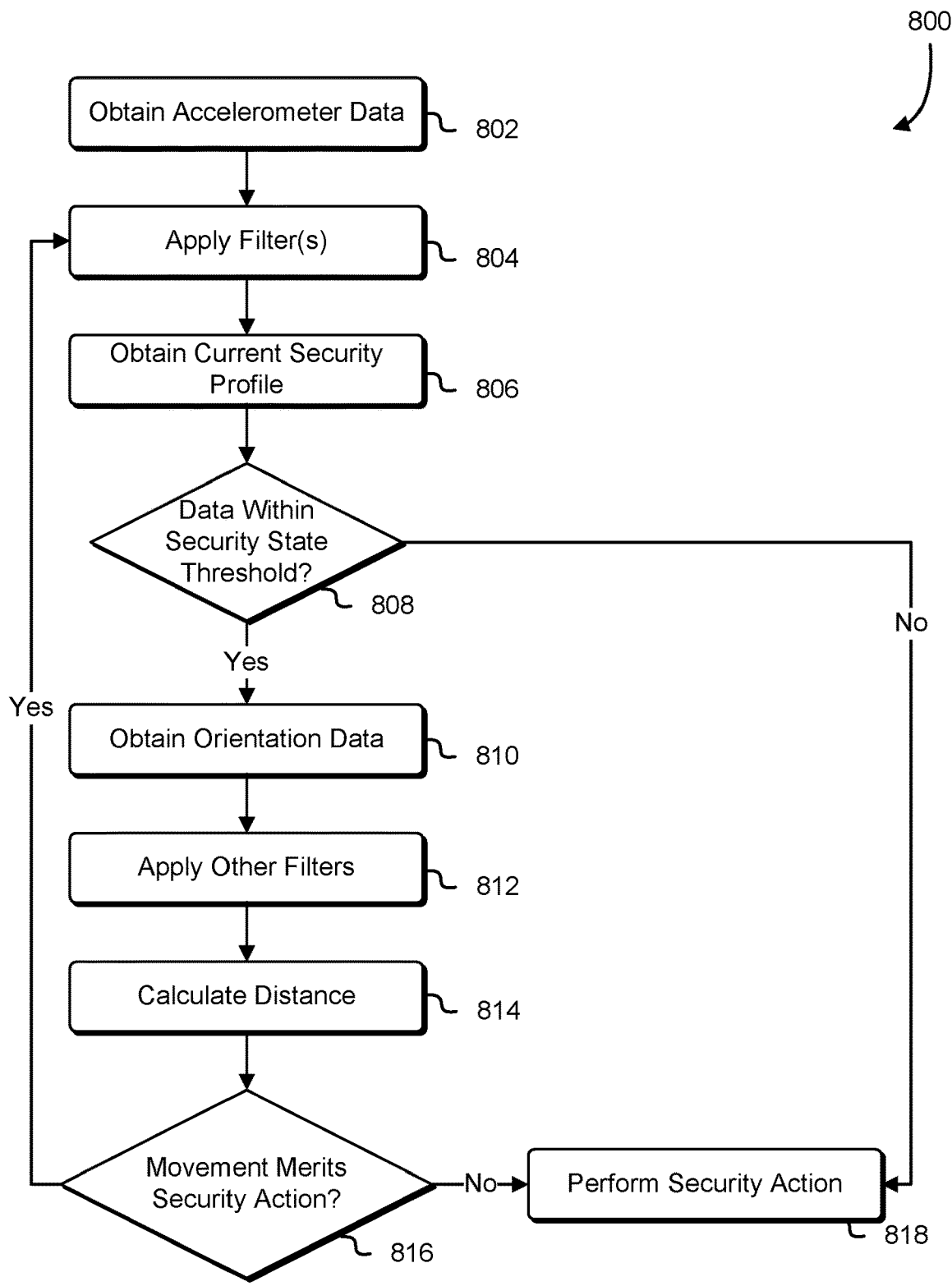
FIG. 8 is a flow chart that illustrates an example of accelerometer-based dead reckoning in accordance with an embodiment.

FIG. 8 is a flow chart illustrating an example of a process 800 for accelerometer-based dead reckoning in accordance with various embodiments. The process 800 may be performed by any suitable device, such as the device 102A-02C. Furthermore, one or more operations of the process 700 may be performed by a computer system in communication with the device, such as a server in a data center, multiple computing devices in a distributed system of a computing resource service provider, or any electronic client device such as the electronic client device 902 described in conjunction with FIG. 9. The process 800 includes a series of operations wherein accelerometer data of a device is received, filtered, linear movement of the device is calculated, and a determination is made whether a change should be made to a security state.

In 802, accelerometer data from a device is received. Note that in some implementations, the accelerometer data is received by the device from an accelerometer integrated or communicatively coupled with the device. In other implementations, the accelerometer data may be received by a computer system, such as a remote server, from the device having the accelerometer. In the latter implementation, the computer system may perform the calculations and make the determinations in 804-16 using information provided to the computer system by the device having the sensors. The accelerometer data received in 802 may be values corresponding to proper acceleration in an X, Y, and Z local coordinate system of the device.

In 804, one or more filters, such as a high-pass filter to smooth jitter and aberrant spikes in the accelerometer data, may be applied to the accelerometer data. In some implementations, other types of filters may be applied, such as a Kalman filter. In still other implementations, no filtering operations may be performed at this stage and the operations of 804 may be omitted. In 806, the current security profile of the device may be obtained. As noted, the current security profile may be a set of one or more profiles having rules, thresholds, and other criteria for determining whether a security event has occurred. Such security profiles may be associated with the particular user signed into the device, may be associated with a particular location of the device, may be associated with a particular time of day, or may be associated with some other situational or environmental state.

In 808, a determination is made, concerning the current security profile, whether the filtered accelerometer data, velocity, or distance is above or below a particular threshold that would indicate a security action should be taken. For example, the device may experience a sudden burst of acceleration which may be suggestive that the device has been swiped by a thief, in which case the system or device performing the process 800 may proceed to 818 to take a security action, such as causing the device to sound an alarm. As another example, the accelerometer data may indicate that the proper acceleration has suddenly decreased to zero, which may indicate that the device has been dropped and is in free fall, in which case the system or device performing the process 800 may proceed to 818 to take an action, such as causing the device to park the heads of a magnetic hard drive to minimize damage to the hard drive.

In 810, the system or device performing the process 800 may receive orientation data indicating the orientation of the device (e.g., tilt, facing direction, etc.). Orientation data may be calculated using data obtained from a gyroscope embedded or communicatively coupled to the device, gravity data obtained from the accelerometer of the device, and/or data from a compass embedded or communicatively coupled to the device. In some implementations, the data from the compass may be adjusted for true north using last known position data obtained from a GPS receiver embedded or communicatively coupled to the device.

In 812, other filters may be applied to any of the sets of data or derived data in the operations of the process 800, such as the accelerometer data obtained in 802 and the orientation data obtained in 810. Note that while the operations of 812 are depicted between the operations of 810 and 814, it is contemplated that other filters may be applied at any stage of the process 800. An example of such other filter could include a Kalman filter usable to filter the data of 810 and 810 to provide a smooth estimate of the position (i.e., dead reckoning) of the device when the device is in a vehicle.

In 814, the linear movement (i.e., straight-line distance traveled) of the device may be calculated. As one example, the accelerometer data may be integrated to yield the velocity of the device, and the orientation data may be used to determine the direction of travel, whereupon a current position of the device and travel path may be determined from both sets of data. Then, in 816, the system or device performing the process 800 may determine, with reference to the current security profile obtained in 806, whether the linear movement calculated in 814 merits change to a security state, a security profile, or causing a security action to be performed.

It is contemplated that the sum of a series of linear movements may indicate the total distance traveled by the device. For example, accelerometer data and gyroscope data may be obtained from sensors of the device at particular slices in time (also referred to as a sample rate or frequency). For a particular slice in time, the acceleration of the device may be assumed to be a constant acceleration in a linear (straight-line) direction, and from that acceleration data, an average velocity and a distance traveled in that direction may be estimated, within a level of error dependent at least in part on the sample rate and sensitivity of the accelerometer. For example, an acceleration vector (Acc) comprising following values may be output or derived from output of the accelerometer:

$A_x(n)$=Acceleration in the X direction at time n
$A_y(n)$=Acceleration in the Y direction at time n
$A_z(n)$=Acceleration in the Z direction at time n However, due to an accelerometer's particular sensitivity to vibrations and sample rate, data from other sensors, such as gyroscopic data and/or GPS data, may be used to calibrate or reduce errors in the accelerometer data. The gyroscope data may indicate a rate of rotation or angles of rotation (e.g., pitch, roll, and yaw) around an axis of the local coordinate system of the device for the particular slice in time, and, because the gyroscope measures rotation, it may be less sensitive to error due to linear movements (e.g., vibrations). Various filters may be utilized to reduce accelerometer data errors (e.g., the simple Kalman filter, the Kalman-Bucy filter, Schmidt's extended filter, the information filter, Bierman and Thornton square-root filters, etc.) based on the aforementioned accelerometer data and/or other sensor data.

Note too, that over time and depending on the sensitivity and sample rate of the accelerometer, velocity and location data based on accelerometer data may "drift," or become less accurate. Thus, the location of the device may be periodically calibrated to a known location, such as by GPS data obtained through a GPS receiver on the device or some other method of determining a precise position of the device, to correct for accumulated drift.

As an example, the path of a device traveling up or down a spiral staircase may comprise a series of straight-line paths, with an accuracy dependent at least in part on the frequency in which the accelerometer data may be sampled. In this example, the sum of the straight-line paths may yield the total distance traveled by the device, with an accuracy based at least in part on the sensitivity of the accelerometer and sample rate of the accelerometer data, up and down the staircase. In some cases, this total distance may indicate the occurrence of an event compelling a change to a security state. In other cases, only movement in a particular plane is used for determining the occurrence of an event triggering a change to a security state. Using the example of the spiral staircase above, it may be appropriate to only track the movement of the device in the horizontal plane relative to the ground (i.e., excluding vertical movement) for determining whether the device has moved from a particular area (e.g., whether the device is still inside a particular building). Similarly, in some other cases, only movement in a particular direction may be used for determining the occurrence of an event triggering a change to a security state. Again using the example of the spiral staircase above, it may be appropriate only to track the movement of the device in the vertical direction, such as for determining whether the device has moved to a different or particular floor of an office building.

Similarly, it may be appropriate to consider only acceleration in certain directions or planes for determining whether an event sufficient to trigger a change to a security state has occurred. For example, sudden upward movement may suggest that the device has been suddenly lifted from its location by a thief, whereas sudden movement in the horizontal plane may be consistent with movement of the device around a conference table in a collaborative work environment. In some cases, movement in one direction or plane may affect a threshold of movement in one or more other directions or planes sufficient to trigger a change in a security state. For example, under a default condition, a threshold distance in a horizontal direction sufficient to trigger a change to a security state may be a first distance value, however sudden acceleration of the device in the vertical distance may cause the threshold distance to be changed (i.e., increased or decreased) to a second distance value.

Determining whether an event triggering a change to a security state has occurred may depend on movement (e.g., acceleration, deceleration, velocity, or distance traveled) of the device exceeding (or falling below) a threshold. For example, moving the device a few inches may not warrant changing to a security state of the device, whereas moving the device more than two feet may warrant changing the security state of the device. Similarly, if, over a period of time, the device moves a much farther distance (e.g., 100 feet) but returns to a location within a threshold distance (e.g., 10 feet) of its starting location (for example, if a user leaves his office with his device, meanders around the workplace, and returns to his office), such movement may not warrant a change to a security state. However, changing a security state, security profile, or causing a security action to be taken may be warranted if the device detects from the linear movement calculated in 814 that the device has left the user's workplace and is now in a public area. In such a case, or in some other case where a change in a security state of the device is warranted, in 818, such a change may be performed. Using the latter example where a user leaves a workplace (low risk of security breach) and enters a public area (higher risk of security breach), the system or device performing the process 800 may perform one or more of a variety of actions, including locking a screen of the device, switching to a different security profile (e.g., "public area profile," etc.), or reducing an idle time threshold specifying when a screensaver of the device is to be launched. Note also that one or more of the operations performed in 802-18 may be performed in various orders and combinations, including in parallel.

Examples of the system of the present disclosure include a case where the device has a file system that supports encryption, such as FileVault 2 or Encrypting File System, and, so long as sensors of the device indicate that the device is within a work place, the file system should remain unencrypted. However, if the sensors of the device detect that the device has left the workplace, the device may encrypt the file system and/or delete the decryption keys from memory.

As another example while the device is in a workplace, the device may be presumed to remain on a desk during working hours and remain relatively motionless. A security profile corresponding to the workplace during working hours may consequently specify that certain security actions should occur, such as locking a screen of the device, if the device is moved or vibrated. On the other hand, a security profile corresponding to the device being located within the home of the user may specify that movement or vibrations within a certain threshold, such as may occur when the device is resting on the lap of a user on a couch, should not trigger a security action.

In another example, the device or agent on the device, such as the accelerometer agent 220 of FIG. 2, may have access to the calendar of the owner of the device. If the accelerometer data indicates that the device is not in the location of a meeting scheduled on the owner's calendar, or has suddenly left the location of the meeting, the device may perform a security action, such as locking the device.

In another example, there may be communication between a first device and a second device, or between a first device and a central server and a second device and a central server. In such an example, detected activity on the first device may cause an action to be performed by the second device, and certain other detected activity by the first or second device may be utilized as a challenge-response in order to confirm or deny taking some security action. For example, if a first device of a user, such as a laptop computer, located at a user's home detects that it is moving or being accessed, it may send a message to a second device, such as a mobile phone of the user, challenging the user to turn the lights in the user's home off for a specified time (e.g., 15 seconds) and then to turn them back on again. If the user is unable to respond to the challenge (e.g., the user is not at home) or if the user indicates through the second device that the movement of the first device is unauthorized, the first device may then perform a specified security action, such as encrypting its file system. Note that in implementations utilizing a central server, the sensor data may be communicated to the central server by the first device, whereupon the central server may initiate the challenge-response with the second device and notify the first device if it receives a response from the second device. Likewise, the first device may notify the central server if the user properly responds to the challenge (e.g., photosensors on the first device may detect that the lights of the aforementioned user were turned off for 15 seconds and then turned back on). Note too, that any number of devices and systems are contemplated in the present disclosure; for example, a third system may be present in the home of the user that has knowledge of when and which lights in the home are turned on or off, and may communicate this information to the central server.

As another example, the system of the present disclosure may be present on a hardware security module, router, or hard drive of a data center. In such a case, if the sensors on the device detect that the device has been removed and transported beyond a certain distance (e.g., 1,000 feet), the device may cause its memory, persistent storage, and/or cryptographic keys to be erased. In a similar manner, the system of the present disclosure may be integrated into a shopping cart and, if the shopping cart is detected as going beyond a certain distance from its home location, the device may cause the wheels of the cart to lock and activate a homing beacon. Likewise, the system of the present disclosure may be implemented on a device that may be attached to a retail items, and, if the device detects that the retail item has left the store without being purchased, the device may take some security action, such as emitting a loud alarm noise. Similarly, a device of the present disclosure may be integrated into a secure item, such as a passport or credit card, and if the secure item is detected as moving away from its authorized user, a security action may be taken, such as rendering the secure item unusable for its particular purpose (e.g., deactivating a credit card account, informing a border security system that the passport has been stolen, etc.). In some embodiments, changing a security state does not include changing a state of a mechanical locking device. Also, in some embodiments, the device lacks a physical storage compartment that mechanically locks as a result of a change to a security state.

Note that, unless otherwise specified, use of expressions regarding executable instructions (also referred to as code, applications, agents, etc.) performing operations that instructions do not ordinarily perform unaided (e.g., transmission of data, calculations, etc.) in the context of describing disclosed embodiments denote that the instructions are being executed by a machine, thereby causing the machine to perform the specified operations.

Figure 9:
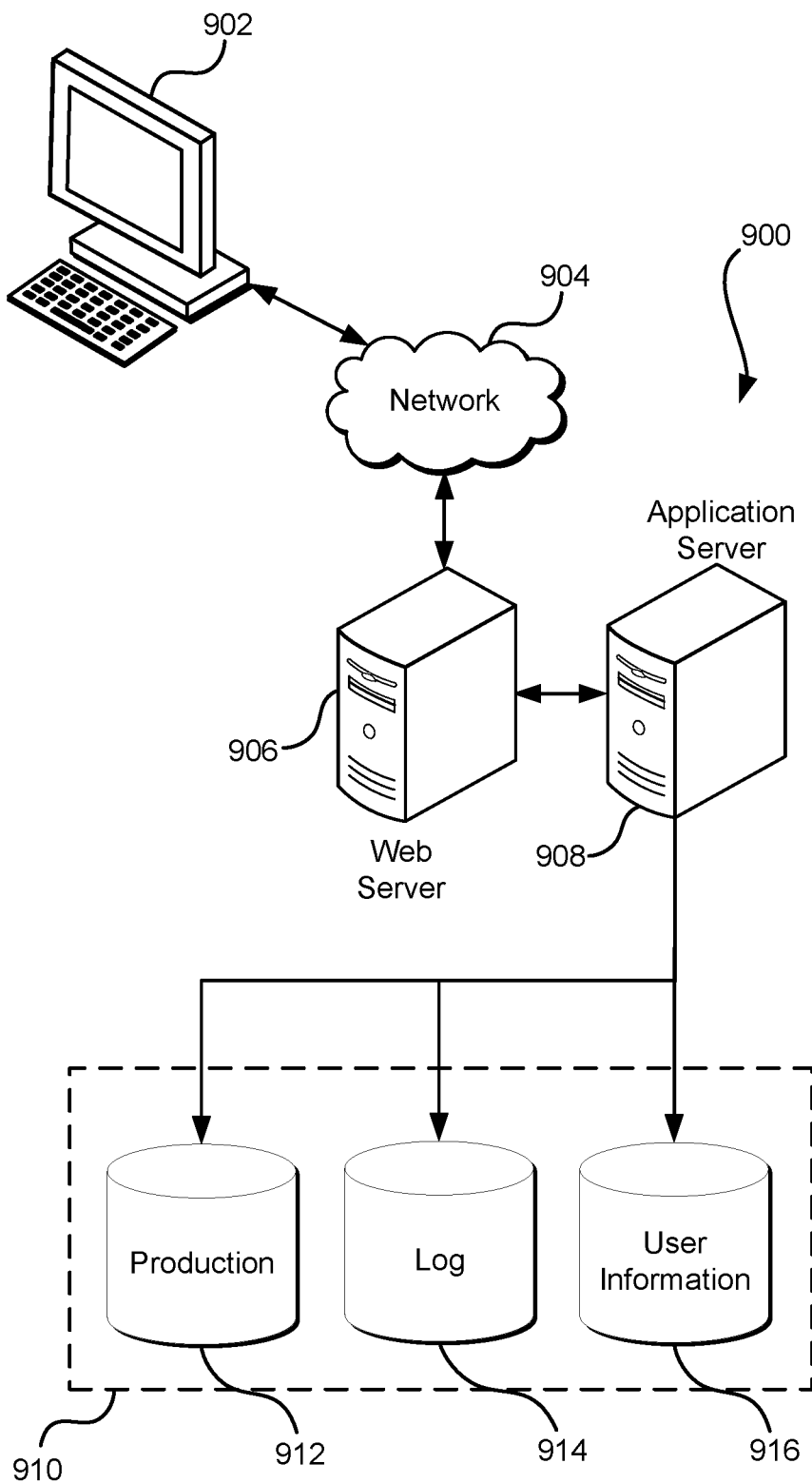
FIG. 9 illustrates an environment in which various embodiments can be implemented.

FIG. 9 illustrates aspects of an example environment 900 for implementing aspects in accordance with various embodiments. As will be appreciated, although a web-based environment is used for purposes of explanation, different environments may be used, as appropriate, to implement various embodiments. The environment includes an electronic client device 902, which can include any appropriate device operable to send and/or receive requests, messages or information over an appropriate network 904 and, in some embodiments, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other network and/or combination thereof. Components used for such a system can depend at least in part upon the type of network and/or environment selected. Protocols and components for communicating via such a network are well known and will not be discussed in detail. Communication over the network can be enabled by wired or wireless connections and combinations thereof. In this example, the network includes the Internet, as the environment includes a web server 906 for receiving requests and serving content in response thereto, although for other networks an alternative device serving a similar purpose could be used as would be apparent to one of ordinary skill in the art.

The illustrative environment includes an application server 908 and a data store 910. It should be understood that there could be several application servers, layers or other elements, processes or components, which may be chained or otherwise configured, which can interact to perform tasks such as obtaining data from an appropriate data store. Servers, as used, may be implemented in various ways, such as hardware devices or virtual computer systems. In some contexts, servers may refer to a programming module being executed on a computer system. As used, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS"), or another appropriate client-side structured language. Content transferred to a client device may be processed by the client device to provide the content in one or more forms including, forms that are perceptible to the user audibly, visually and/or through other senses including touch, taste, and/or smell. The handling of all requests and responses, as well as the delivery of content between the electronic client device 902 and the application server 908, can be handled by the web server using PHP: Hypertext Preprocessor ("PHP"), Python, Ruby, Perl, Java, HTML, XML, or another appropriate server-side structured language in this example. It should be understood that the web and application servers are not required and are merely example components, as structured code discussed can be executed on any appropriate device or host machine as discussed elsewhere. Further, operations described as being performed by a single device may, unless otherwise clear from context, be performed collectively by multiple devices, which may form a distributed and/or virtual system.

The data store 910 can include several separate data tables, databases, data documents, dynamic data storage schemes and/or other data storage mechanisms and media for storing data relating to a particular aspect of the present disclosure. For example, the data store illustrated may include mechanisms for storing production data 912 and user information 916, which can be used to serve content for the production side. The data store also is shown to include a mechanism for storing log data 914, which can be used for reporting, analysis or other purposes. It should be understood that there can be many other aspects that may need to be stored in the data store, such as page image information and access rights information, which can be stored in any of the above listed mechanisms as appropriate or in additional mechanisms in the data store 910. The data store 910 is operable, through logic associated therewith, to receive instructions from the application server 908 and obtain, update or otherwise process data in response thereto. The application server 908 may provide static, dynamic or a combination of static and dynamic data in response to the received instructions. Dynamic data, such as data used in web logs (blogs), shopping applications, news services and other applications may be generated by server-side structured languages as described or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the electronic client device 902. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 9. Thus, the depiction of the example environment 900 in FIG. 9 should be taken as being illustrative in nature and not limiting to the scope of the disclosure.

The various embodiments further can be implemented in a wide variety of operating environments, which in some cases can include one or more user computers, computing devices or processing devices that can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize a network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network, and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, a central processing unit ("CPU" or "processor"), an input device (e.g., a mouse, keyboard, controller, touch screen or keypad), and an output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a wireless or wired network card, an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within a working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided, a person of ordinary skill in the art will appreciate other ways and/or methods to implement the various embodiments.

The specification and drawings are, accordingly, to be regarded in an illustrative rather than a restrictive sense. However, it will be evident that various modifications and changes may be made thereunto without departing from the broader spirit and scope of the invention as set forth in the claims.

Other variations are within the spirit of the present disclosure. Thus, while the techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a," "an," and "the" and similar referents in the context of describing the embodiments (especially in the context of the following claims) are to be construed to cover both the singular and the plural, unless otherwise indicated or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values are merely intended to serve as a shorthand method of referring individually to each separate value falling within the range, unless otherwise indicated and each separate value is incorporated into the specification as if it were individually recited. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," is understood with the context as used in general to present that an item, term, etc., may be either A or B or C, or any nonempty subset of the set of A and B and C, unless specifically stated otherwise or otherwise clearly contradicted by context. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described can be performed in any suitable order unless otherwise indicated or otherwise clearly contradicted by context. Processes described (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising instructions executable by one or more processors. The computer-readable storage medium may be non-transitory.

The use of any examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. A computer-implemented method, comprising:
    accessing a security profile of a device including a plurality of conditions, the security profile comprising a first security state associated with a first condition of the plurality of conditions of the device and a second security state associated with a second condition of the plurality of conditions of the device, wherein the first condition comprises movement data indicating that the device is under the control of an authorized user;
    obtaining a first set of movement data from a movement-based sensor of the device;
    comparing the first set of movement data with the plurality of conditions;
    setting a security state of the device to the first security state in response to determining that the first condition has been satisfied based on the comparing;
    obtaining a second set of movement data from the movement-based sensor of the device;
    determining, based on the second set of movement data being below a movement threshold and greater than zero, satisfaction of the second condition, wherein the second set of movement data being below the movement threshold indicates that the device is not under the control of the authorized user, and wherein the second set of movement data being greater than zero accounts for sensitivity of one or more sensors of the device improperly indicating that the device is moving; and
    changing the security state of the device to the second security state in response to determining that the second condition has been satisfied, wherein the second security state comprises a locked state of the device.

2. The computer-implemented method of claim 1, wherein the movement data indicating that the device is under the control of the authorized user comprises movement data indicative of a gait of the authorized user or another user.

3. The computer-implemented method of claim 2, wherein the gait of the authorized user is determined based at least in part on hysteresis of the device in a similar environment.

4. The computer-implemented method of claim 1, wherein the movement data indicating that the device is under the control of the authorized user comprises movement data indicative of at least one of placing the device in a pocket or taking the device out of the pocket.

5. The computer-implemented method of claim 1, wherein the movement data indicating that the device is under the control of the authorized user comprises movement data indicative of the device currently moving.

6. The computer-implemented method of claim 1, wherein obtaining the first set of movement data and the second set of movement data from a movement-based sensor of the device comprises obtaining at least one of accelerometer data from an accelerometer or gyroscope data from a gyroscope.

7. A system, comprising:
one or more processors; and
memory including instructions that, as a result of execution by the one or more processors, cause the system to:
obtain a security profile of a device comprising a plurality of conditions, the security profile comprising a first security state associated with a first condition of the plurality of conditions of the device and a second security state associated with a second condition of the plurality of conditions of the device, wherein the first security state comprises an unlocked state of the device, wherein the second condition comprises movement data indicating that the device is not under the control of an authorized user;
obtain a first set of movement data from at least one sensor of the device, wherein the first set of movement data comprises at least two of location data, velocity data, or acceleration data, and wherein the device is set to the first security state based at least in part on receiving an input to temporarily suspend, for a time period, changing a security state of the device to the second security state based on at least one sensor input;
compare the first set of movement data with the plurality of conditions; and
change a security state of the device to the second security state from the first security state in response to determining that the second condition has been satisfied based on the comparing and upon determining that the time period has expired.

8. The system of claim 7, wherein the second security state comprises a locked state of the device.

9. The system of claim 7, wherein the second condition comprises movement data indicating that the device has moved a first distance away from the authorized user.

10. The system of claim 7, wherein the second condition comprises movement data indicative of a change of movement of the device exceeding a threshold movement.

11. The system of claim 7, wherein the first condition comprises movement data indicating that the device is under the control of the authorized user.

12. The system of claim 11, wherein the movement data indicating that the device is under the control of the authorized user comprises movement data indicative of a gait of the authorized user or another user.

13. The system of claim 11, wherein the movement data indicating that the device is under the control of the authorized user comprises movement data indicative of at least one of placing the device in a pocket or taking the device out of the pocket.

14. The system of claim 11, wherein the movement data indicating that the device is under the control of the authorized user comprises movement data indicative of the device currently moving.

15. The system of claim 7, wherein obtaining the first set of movement data from the at least one sensor comprises obtaining at least one of accelerometer data from an accelerometer, gyroscope data from a gyroscope, or image data from an image sensor or photosensor.

16. A non-transitory computer-readable storage medium having stored thereon executable instructions that, as a result of execution by one or more processors of a computer system, cause the computer system to at least:
obtain a security profile of a device comprising a first security state associated with a first condition of the device, wherein the first condition comprises movement data indicating that the device is under the control of an authorized user;
obtain a first set of movement data from at least one movement-based sensor of the device, the first set of movement data comprises at least acceleration data;
compare the first set of movement data with the first condition; and
change a security state of the device to the first security state in response to determining that the first condition has been satisfied based on the comparing, wherein the first security state comprises disabling a locking feature of the device or lengthening a period of time before the device goes into a locked security state;
receive an input to temporarily suspend for a time period changing the security state of the device to the locked security state based on at least one sensor input;
obtain a second set of movement data from the at least one movement-based sensor of the device, the second set of movement data indicating that the device is not under the control of the authorized user; and
delay changing the security state of the device to the locked security state based on the second set of movement data until expiration of the time period.

17. The non-transitory computer-readable storage medium of claim 16, wherein the movement data indicating that the device is under the control of the authorized user comprises movement data indicative of at least one of placing the device in a pocket or taking the device out of the pocket.

18. The non-transitory computer-readable storage medium of claim 16, wherein the movement data indicating that the device is under the control of the authorized user comprises movement data indicative of the device currently moving.

19. The non-transitory computer-readable storage medium of claim 16, wherein the movement data indicating that the device is under the control of the authorized user comprises movement data indicative of a gait of the authorized user or another user.

* * * * *